(12) United States Patent  (10) Patent No.: US 10,605,835 B2
Kawanami et al.  (45) Date of Patent: Mar. 31, 2020

(54) CURRENT SENSOR

(71) Applicant: Murata Manufacturing Co., Ltd., Nagaokakyo-shi, Kyoto-fu (JP)

(72) Inventors: Takashi Kawanami, Nagaokakyo (JP); Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 262 days.

(21) Appl. No.: 15/590,035

(22) Filed: May 9, 2017

(65) Prior Publication Data

US 2017/0242058 A1   Aug. 24, 2017

Related U.S. Application Data

(63) Continuation of application No. PCT/JP2015/082749, filed on Nov. 20, 2015.

(30) Foreign Application Priority Data

Feb. 2, 2015 (JP) ................................. 2015-018324

(51) Int. Cl.
*G01R 15/20* (2006.01)
*G01R 7/02* (2006.01)
(Continued)

(52) U.S. Cl.
CPC .............. *G01R 15/20* (2013.01); *G01R 7/02* (2013.01); *G01R 15/207* (2013.01); *G01R 33/02* (2013.01); *G01R 33/075* (2013.01)

(58) Field of Classification Search
CPC .... G01R 15/20; G01R 15/207; G01R 33/075; G01R 33/02; G01R 7/02
(Continued)

(56) References Cited

U.S. PATENT DOCUMENTS

2007/0096717 A1   5/2007  Ishihara
2012/0217963 A1   8/2012  Naka et al.
(Continued)

FOREIGN PATENT DOCUMENTS

CN   103403558 A   11/2013
CN   103765230 A    4/2014
(Continued)

OTHER PUBLICATIONS

Official Communication issued in corresponding Japanese Patent Application No. 2016-573188, dated Jul. 11, 2017.
(Continued)

*Primary Examiner* — Farhana A Hoque
(74) *Attorney, Agent, or Firm* — Keating & Bennett, LLP

(57) ABSTRACT

A current sensor includes a substrate including a through-hole and at least one groove around the through-hole, a primary conductor extending into the through-hole and through the substrate, and through which a current to be measured flows, at least one magnetic sensor that is mounted on a first surface of the substrate and detects a strength of a magnetic field generated by the current to be measured flowing through the primary conductor, and at least one magnetic body surrounding the primary conductor and including a portion extending in the at least one groove to be fixed to the substrate.

20 Claims, 10 Drawing Sheets

(51) Int. Cl.
*G01R 33/02* (2006.01)
*G01R 33/07* (2006.01)

(58) Field of Classification Search
USPC ................................. 324/225, 253, 117 H
See application file for complete search history.

(56) References Cited

U.S. PATENT DOCUMENTS

| | | | | |
|---|---|---|---|---|
| 2012/0262152 | A1* | 10/2012 | Ausserlechner | G01R 33/072 324/117 R |
| 2013/0300404 | A1* | 11/2013 | Hebiguchi | G01R 15/205 324/225 |
| 2014/0184212 | A1 | 7/2014 | Yamaguchi et al. | |
| 2014/0210463 | A1* | 7/2014 | Klein | G01R 33/0052 324/253 |
| 2017/0242058 | A1 | 8/2017 | Kawanami et al. | |

FOREIGN PATENT DOCUMENTS

| | | |
|---|---|---|
| JP | 60-39297 U | 3/1985 |
| JP | 60-136196 U | 9/1985 |
| JP | 04-33542 A | 2/1992 |
| JP | 09-127159 A | 5/1997 |
| JP | 10-22679 A | 1/1998 |
| JP | 2007-121239 A | 5/2007 |
| JP | 2007-187528 A | 7/2007 |
| JP | 2010-008050 A | 1/2010 |
| JP | 2011-227062 A | 11/2011 |
| JP | 2011-242276 A | 12/2011 |
| JP | 2012-215488 A | 11/2012 |
| JP | 2013-088370 A | 5/2013 |
| JP | 2014-006181 A | 1/2014 |
| JP | 2014-531018 A | 11/2014 |
| JP | 6344488 B2 | 6/2018 |
| WO | 2012/120939 A1 | 9/2012 |

OTHER PUBLICATIONS

Official Communication issued in corresponding Japanese Patent Application No. 2018-093565, dated Feb. 19, 2019.
Official Communication issued in corresponding Japanese Patent Application No. 2016-573188, dated Feb. 20, 2018.
Official Communication issued in International Patent Application No. PCT/JP2015/082749, dated Dec. 15, 2015.

* cited by examiner

FIG.14
FIG.15

CURRENT SENSOR

CROSS REFERENCE TO RELATED APPLICATIONS

This application claims the benefit of priority to Japanese Patent Application No. 2015-018324 filed on Feb. 2, 2015 and is a Continuation application of PCT Application No. PCT/JP2015/082749 filed on Nov. 20, 2015. The entire contents of each application are hereby incorporated herein by reference.

BACKGROUND OF THE DESCRIPTION

1. Field of the Invention

The present invention relates to current sensors, and particularly relates to a current sensor that measures a value of a current to be measured by detecting a magnetic field generated in proportion to the current to be measured.

2. Description of the Related Art

Japanese Unexamined Patent Application Publication No. 4-33542 and Japanese Unexamined Patent Application Publication No. 9-127159 disclose configurations of current detectors.

In a current detector of a servo drive device described in Japanese Unexamined Patent Application Publication No. 4-33542, a magnetic core having a gap for inserting a Hall element therein is fixedly attached to a printed circuit board, and the Hall element is located and mounted in the gap for inserting the Hall element. Each terminal of the Hall element is electrically connected to a terminal of circuit wiring formed in or on the printed circuit board.

A current detector described in Japanese Unexamined Patent Application Publication No. 9-127159 includes a magnetic core having a gap in part of a magnetic path formed in a circular shape, and a magnetosensitive element that is disposed in the gap and detects the density of magnetic flux passing through the gap. A through-hole, through which a current wire to be measured passes, is formed in a printed circuit board. The magnetosensitive element is disposed in the vicinity of a circumference edge of the through-hole. A grounding pattern connected to a ground line is formed on the printed circuit board. The magnetic core is fixed on the grounding pattern with a conductive adhesive.

In the current detectors described in Japanese Unexamined Patent Application Publication No. 4-33542 and Japanese Unexamined Patent Application Publication No. 9-127159, a magnetic body as a magnetic core is arranged on a surface of the printed circuit board. A Hall element is arranged in the vicinity of the center of the magnetic body in a thickness direction of the printed circuit board. In the above configuration, the height of the current detector becomes large in proportion to the height of the magnetic body in the thickness direction of the printed circuit board. This means there is room for further miniaturization of the current detector.

SUMMARY OF THE INVENTION

In consideration of the above issue, preferred embodiments of the present invention provide a miniaturized current sensor.

A current sensor according to a preferred embodiment of the present invention includes a substrate including a through-hole and at least one groove around the through-hole; a primary conductor extending into the through-hole and through the substrate, and through which a current to be measured flows; at least one magnetic sensor that is mounted on a first surface of the substrate and detects a strength of a magnetic field generated by the current to be measured flowing through the primary conductor; and at least one magnetic body surrounding the primary conductor and including a portion in the at least one groove to be fixed to the substrate.

According to a preferred embodiment of the present invention, the at least one magnetic body preferably has a plate shape. A thickness direction of the at least one magnetic body extends along the first surface of the substrate.

According to a preferred embodiment of the present invention, substantially half of a width of the at least one magnetic body is located in the at least one groove.

According to a preferred embodiment of the present invention, the primary conductor preferably has a plate shaped outer periphery. The at least one magnetic sensor is able to detect a magnetic field in a direction perpendicular or substantially perpendicular to both a thickness direction of the primary conductor and a direction perpendicular or substantially perpendicular to the first surface of the substrate.

According to a preferred embodiment of the present invention, the at least one magnetic sensor is provided on at least one of a first side and a second side in the thickness direction of the primary conductor at a center portion in a width direction of the primary conductor.

According to a preferred embodiment of the present invention, the at least one magnetic sensor is surrounded by the at least one magnetic body.

According to a preferred embodiment of the present invention, the at least one magnetic body preferably has a rectangular or substantially rectangular shape including at least one gap between end portions thereof when viewed in a direction perpendicular or substantially perpendicular to the first surface of the substrate. Each of the at least one magnetic sensor is located in the at least one gap.

According to a preferred embodiment of the present invention, the at least one magnetic sensor includes a first magnetic sensor and a second magnetic sensor. The first magnetic sensor and the second magnetic sensor are positioned with the primary conductor interposed therebetween while respectively being spaced from the primary conductor.

According to a preferred embodiment of the present invention, a calculator calculates a value of the current by computing a detection value of the first magnetic sensor and a detection value of the second magnetic sensor. With regard to the strength of the magnetic field generated by the current flowing through the primary conductor, a phase of the detection value of the first magnetic sensor is reverse to a phase of the detection value of the second magnetic sensor. The calculator preferably is a subtractor or a differential amplifier.

According to a preferred embodiment of the present invention, a calculator calculates a value of the current by computing a detection value of the first magnetic sensor and a detection value of the second magnetic sensor. With regard to the strength of the magnetic field generated by the current flowing through the primary conductor, a phase of the detection value of the first magnetic sensor matches a phase of the detection value of the second magnetic sensor. The calculator preferably is an adder or a summing amplifier.

According to various preferred embodiments of the present invention, miniaturized current sensors are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14 is a perspective view illustrating an external appearance of a magnetic sensor unit of a current sensor according to a sixth preferred embodiment of the present invention.

FIG. 15 is a perspective view illustrating an external appearance of a magnetic sensor unit of a current sensor according to a seventh preferred embodiment of the present invention.

DETAILED DESCRIPTION OF THE PREFERRED EMBODIMENTS

Figure 1:
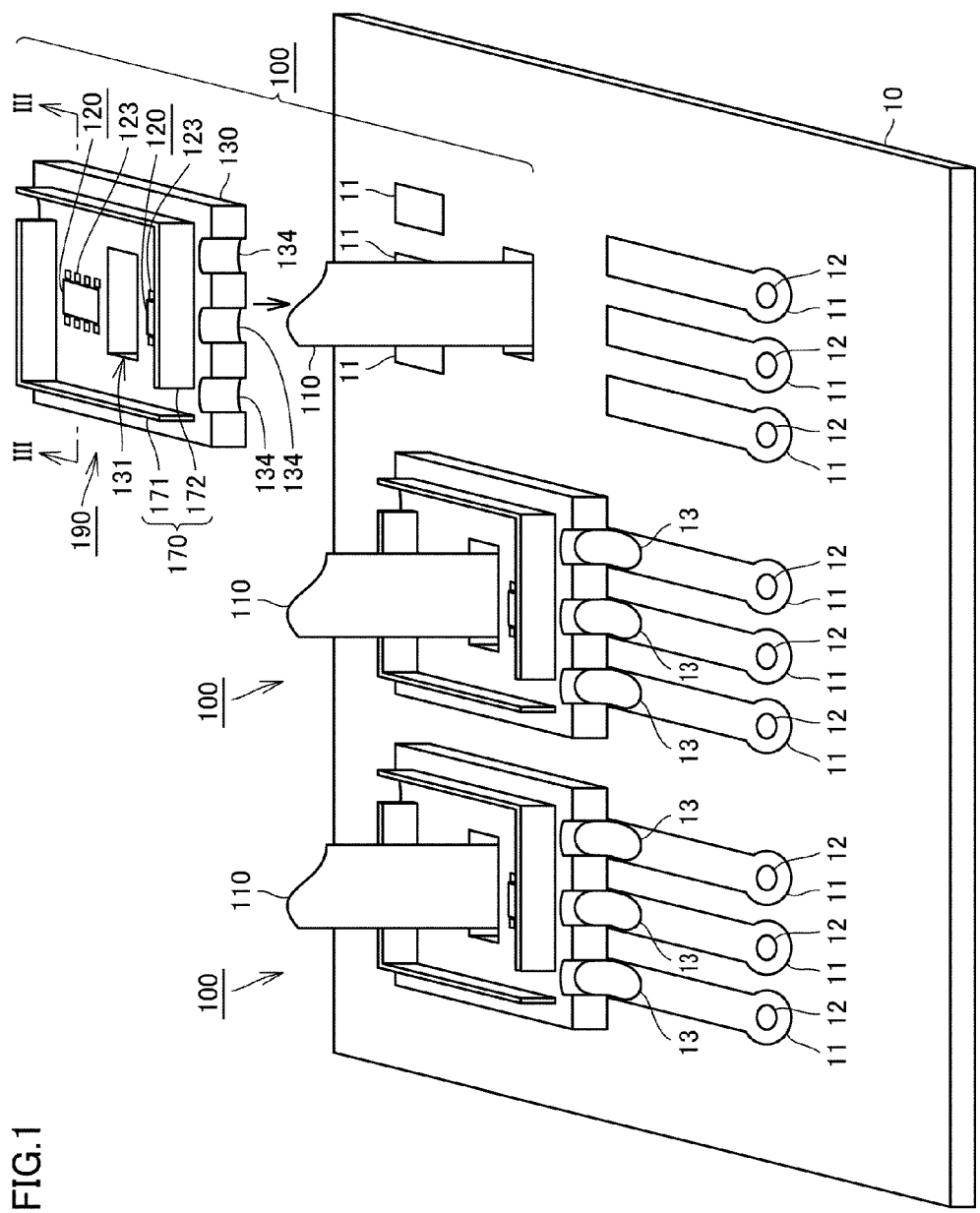
FIG. 1 is a plan view illustrating a configuration of a current sensor module including three current sensors according to a first preferred embodiment of the present invention.

Hereinafter, current sensors according to preferred embodiments of the present invention will be described with reference to the drawings. In the description of the preferred embodiments below, identical reference signs will be assigned to identical or corresponding portions in the drawings and description thereof will not be repeated.

First Preferred Embodiment

Figure 2:
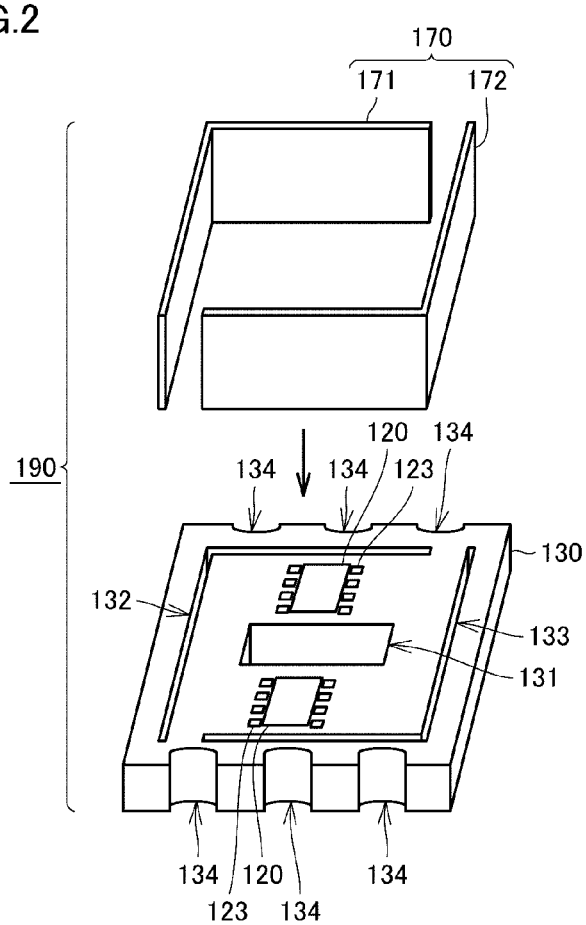
FIG. 2 is an exploded perspective view illustrating a configuration of a current sensor according to the first preferred embodiment of the present invention.
Figure 3:
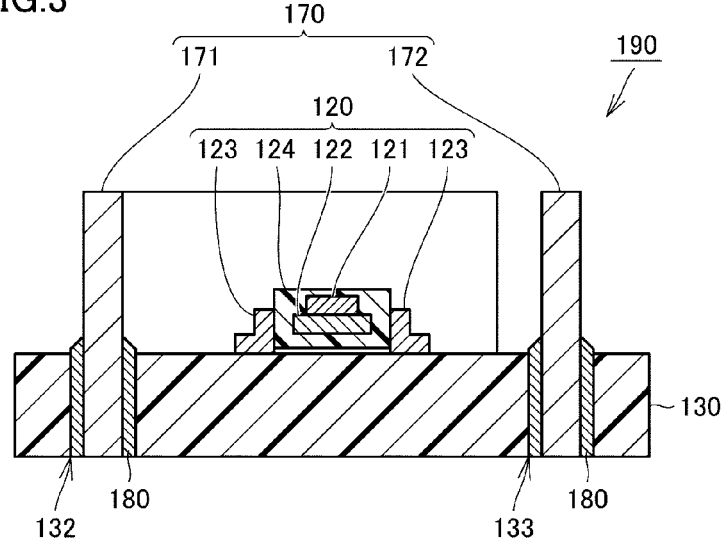
FIG. 3 is a cross-sectional view of the current sensor according to the first preferred embodiment of the present invention when viewed in a III-III arrow line direction in FIG. 1.
Figure 4:
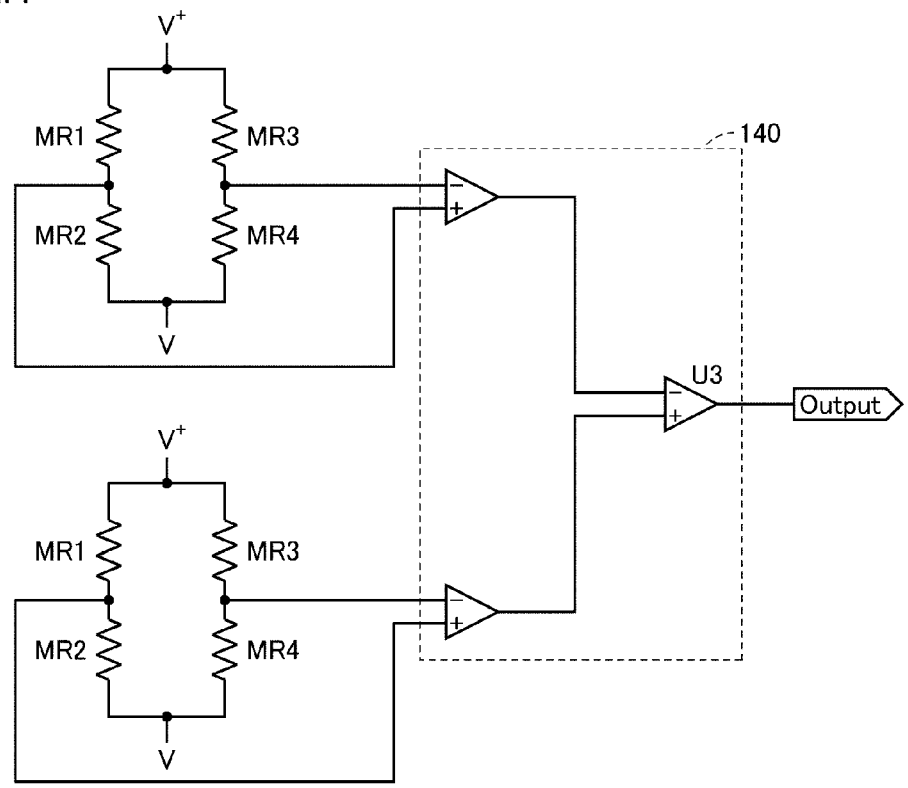
FIG. 4 is a circuit diagram illustrating a circuit configuration of the current sensor according to the first preferred embodiment of the present invention.

FIG. 1 is a plan view illustrating a configuration of a current sensor module including three current sensors according to a first preferred embodiment of the present invention. FIG. 2 is an exploded perspective view illustrating a configuration of a current sensor according to the first preferred embodiment of the present invention. FIG. 3 is a cross-sectional view of the current sensor according to the first preferred embodiment of the present invention when viewed in a III-III arrow line direction in FIG. 1. FIG. 4 is a circuit diagram illustrating a circuit configuration of the current sensor according to the first preferred embodiment of the present invention.

As shown in FIGS. 1 to 4, a current sensor 100 according to the first preferred embodiment of the present invention includes a substrate 130 in which a through-hole 131 and at least one groove positioned around the through-hole 131 are provided; a primary conductor 110 that is located in the through-hole 131 to extend through the substrate 130, and through which a current to be measured flows; at least one magnetic sensor 120 that is mounted on a first surface of the substrate 130 and detects a strength of a magnetic field generated by the current to be measured flowing through the primary conductor 110; and at least one magnetic body surrounding the primary conductor 110 while a portion thereof is located in the at least one groove to be fixed to the substrate 130.

The current sensor 100 according to the present preferred embodiment includes the primary conductor 110 and a magnetic sensor unit 190 that is combined with the primary conductor 110. The magnetic sensor unit 190 includes the substrate 130 in or on which an electric circuit is provided, two magnetic sensors 120, and a magnetic body 170. The magnetic body 170 preferably includes a first magnetic body 171 and a second magnetic body 172.

The current sensor 100 preferably includes a first magnetic sensor and a second magnetic sensor. Although the current sensor 100 according to the present preferred embodiment includes the two magnetic sensors 120, the present invention is not limited thereto. It is sufficient that the current sensor 100 includes at least one magnetic sensor 120.

Hereinafter, elements of the current sensor 100 will be described in detail.

In this preferred embodiment, the primary conductor 110 preferably has a plate-shaped outer periphery. The primary conductor 110 is preferably made of copper. Note that, however, the material of the primary conductor 110 is not limited to copper, and may be a metal such as silver, aluminum or the like, or an alloy containing these metals. Surface finishing may be performed on the primary conductor 110. For example, at least a single-layered plating layer formed with a metal such as nickel, tin, silver, copper or the like, or an alloy containing these metals may be provided on a surface of the primary conductor 110.

In the present preferred embodiment, the primary conductor 110 is formed preferably by performing press working on a thin plate. Note that, however, the forming method for the primary conductor 110 is not limited thereto, and the primary conductor 110 may be formed by a method such as cutting work, casting, or the like. A through-hole or a recess may be provided in the primary conductor 110. A current to be measured that flows through the primary conductor 110 flows in an extending direction of the primary conductor 110, that is, in a direction perpendicular or substantially perpendicular to the first surface of the substrate 130.

A gap is located between the primary conductor 110 and the through-hole 131 of the substrate 130. In the preferred embodiment, although the air is present in the gap between the primary conductor 110 and the through-hole 131 of the substrate 130, the present invention is not limited thereto. An insulative resin may be disposed in the gap between the primary conductor 110 and the through-hole 131 of the substrate 130.

The substrate 130 includes a substrate main body made of glass epoxy or ceramics such as alumina, and wiring made of a metal foil such as a copper foil, that is patterned on the substrate main body.

In the present preferred embodiment, the substrate 130 has a rectangular or substantially rectangular parallelepiped outer shape. The rectangular or substantially rectangular through-hole 131, into which the primary conductor 110 is located, is provided at the center of the substrate 130 when viewed in a direction perpendicular or substantially perpendicular to the first surface of the substrate 130.

In the substrate 130, there are provided a first through-groove 132 and a second through-groove 133 that preferably have a rectangular or substantially rectangular shape surrounding the through-hole 131 when viewed in a direction perpendicular or substantially perpendicular to the first surface of the substrate 130. When viewed in the direction perpendicular or substantially perpendicular to the first surface of the substrate 130, each of the first through-groove 132 and the second through-groove 133 preferably has an L shape extending along an edge of the substrate 130. In this preferred embodiment, although the first through-groove 132 and the second through-groove 133 are respectively provided by router processing, the present invention is not limited thereto and they may be formed by press working, for example.

In the substrate 130 of the current sensor 100 according to the present preferred embodiment, although two grooves are provided, the present invention is not limited thereto. It is sufficient that at least one groove is provided. Further, the shape of the groove is appropriately determined in accordance with the shape of the magnetic body of the magnetic body 170. Furthermore, in this preferred embodiment, a plating film is provided on an inner circumference surface of each of the first through-groove 132 and the second through-groove 133. Note that, however, the stated plating film may not necessarily be provided.

On an outer circumference of the substrate 130, there are provided a plurality of through-hole electrodes 134 each preferably having a half cylinder shape connecting the first surface of the substrate 130 and a second surface thereof that opposes the first surface. Each of the plurality of through-hole electrodes 134 is electrically connected, through the wiring, to a signal processing integrated circuit (IC) included in the magnetic sensor 120 to be explained later. The current sensor 100 is supplied with power from the exterior through each of the plurality of through-hole electrodes 134, and outputs a current measurement value signal to the exterior.

The magnetic sensor 120 includes a magnetic sensor chip in which there are provided a first silicon substrate 121 on a first surface of which a magnetosensitive element is provided and a second silicon substrate 122 that is mounted on the first silicon substrate 121 on a first surface of which the signal processing integrated circuit is provided. The magnetosensitive element and the signal processing integrated circuit are connected to each other by wire bonding. The first silicon substrate 121 and the second silicon substrate 122 are mechanically bonded to each other with a die bonding agent.

The magnetic sensor chip is placed on a lead frame (not shown) and is sealed with an insulative resin 124 by transfer molding in a state of being die-ponded and wire-bonded with respect to the lead frame. The lead frame is electrically connected to a mounting terminal 123 exposed from the insulative resin 124. The mounting terminal 123 is electrically connected to the wiring positioned in the first surface of the substrate 130.

On the first surface of the substrate 130, the first magnetic sensor is positioned on a first side in a short side direction of the through-hole 131 while the second magnetic sensor is positioned on the other side in the short side direction of the through-hole 131. The first magnetic sensor and the second magnetic sensor are positioned respectively being spaced from the primary conductor 110 and opposing each other with the primary conductor 110 interposed therebetween. To be specific, the first magnetic sensor is disposed on a first side in a thickness direction of the primary conductor 110 at a center portion in a width direction of the primary conductor 110. The second magnetic sensor is disposed on the other side in the thickness direction of the primary conductor 110 at the center portion in the width direction of the primary conductor 110.

A detection axis direction (magnetosensitive direction) of each of the first magnetic sensor and the second magnetic sensor extends along the width direction of primary conductor 110. In other words, each of the first magnetic sensor and the second magnetic sensor is able to detect a magnetic field in a direction perpendicular or substantially perpendicular to both the thickness direction of the primary conductor 110 and a direction perpendicular or substantially perpendicular to the first surface of the substrate 130.

Each of the first magnetic sensor and the second magnetic sensor has odd function input-output characteristics, by which the sensor outputs a positive value when having detected a magnetic field facing one direction of the detection axis and outputs a negative value when having detected a magnetic field facing the opposite direction to the one direction of the detection axis.

As shown in FIG. 4, each of the first magnetic sensor and the second magnetic sensor includes a Wheatstone bridge-type bridge circuit including four AMR (Anisotropic Magneto Resistance) elements defining and functioning as magnetosensitive elements. Each of the first magnetic sensor and the second magnetic sensor may include, in place of the AMR elements, magnetoresistance effect elements such as GMR (Giant Magneto Resistance) elements, TMR (Tunnel Magneto Resistance) elements, BMR (Balistic Magneto Resistance) elements, CMR (Colossal Magneto Resistance) elements, or the like. Further, each of the first magnetic sensor and the second magnetic sensor may include a half-bridge circuit including two magnetoresistance effect elements. In addition, as the first magnetic sensor and the second magnetic sensor, a magnetic sensor including a Hall element, a magnetic sensor including a MI (Magneto Impedance) element making use of a magneto-impedance effect, a flux gate-type magnetic sensor, or the like can be used. Magnetosensitive elements such as a magnetoresistance effect element, a Hall element, and the like may be sealed with an insulative resin as discussed above, or may experience potting with a silicone resin, an epoxy resin, or the like.

The signal processing integrated circuit included in each of the first magnetic sensor and the second magnetic sensor includes a driver that applies a bias voltage on the magnetosensitive element or flows a bias current into the magnetosensitive element, an amplifier to amplify output of the magnetosensitive element, a calculator 140 to compute each of the detection values of the first magnetic sensor and the second magnetic sensor, and so on.

When computing each of the detection values of the first magnetic sensor and the second magnetic sensor, the calculator 140 of the signal processing integrated circuit of the magnetic sensor chip of one of the first magnetic sensor and the second magnetic sensor is used. In the current sensor 100 according to the present preferred embodiment, the calculator 140 preferably is a differential amplifier, for example. Note that, however, the calculator 140 may be a subtractor. The calculator 140 calculates a value of the current flowing through the primary conductor 110 by computing the detection value of the first magnetic sensor and the detection value of the second magnetic sensor.

Each of the AMR elements of the first magnetic sensor and the second magnetic sensor may have odd function input-output characteristics by including a barber-pole type electrode. To be specific, by each of the AMR elements of the first magnetic sensor and second magnetic sensor including a barber-pole type electrode, a bias may be applied so that the current flows at a predetermined angle. In addition to this, the AMR element may be biased by using an induction field generated around a coil, a magnetic field of a permanent magnet, or a magnetic field in which these magnetic fields are combined. Alternatively, a layer capable of generating a bias magnetic field may be provided inside a film of the AMR element.

A magnetization direction of a magnetic resistance film in the four AMR elements of the first magnetic sensor and a magnetization direction of a magnetic resistance film in the four AMR elements of the second magnetic sensor are the same. With this, a decrease in output accuracy affected by the external magnetic field is significantly reduced or prevented.

In each of the first magnetic sensor and the second magnetic sensor, open-loop magnetic field measurement, which does not include an exciting coil, may be carried out. In this case, each of the first magnetic sensor and the second magnetic sensor outputs a detection value through the amplifier and a converter of the signal processing integrated circuit that linearly amplifies the output of the magnetosensitive element or amplify the output of the magnetosensitive element while performing correction thereupon.

Alternatively, in each of the first magnetic sensor and the second magnetic sensor, closed-loop magnetic field measurement, which includes an exciting coil, may be carried out. In this case, each signal processing integrated circuit of the first magnetic sensor and the second magnetic sensor includes an exciting coil closed-loop.

In this signal processing integrated circuit, a driving current is supplied from the driver to the exciting coil. A magnetic field generated by the driving current flowing through the exciting coil is applied to the magnetosensitive element. A magnetic field generated by the current having flowed through the primary conductor 110 is also applied to the magnetosensitive element. Because of this, the magnetic field generated from the exciting coil and the magnetic field generated by the current having flowed through the primary conductor 110 are superposed and applied to the magnetosensitive element.

The strengths of the magnetic fields superposed and applied to the magnetosensitive element as described above has a value of strength obtained by superposing the two magnetic fields based on what is called the principle of superposition. The driver supplies the driving current to the exciting coil so that the strength of the magnetic fields superposed and applied to the magnetosensitive element becomes 0 or a constant strength by negative feedback. By measuring the driving current at this time with a current-detection resistor section and the amplifier of the signal processing integrated circuit, the strength of the magnetic field generated by the current having flowed through the primary conductor 110 is able to be indirectly measured.

As discussed above, in the case of carrying out the closed-loop magnetic field measurement, because the measurement is carried out in a state where the magnetic field of a constant strength (approximately 0) is being applied to the magnetosensitive element, it is possible to reduce the influence of nonlinearity of input-output characteristics (relationship between the input magnetic field and the output voltage) of the magnetosensitive element exerted on the linearity of the measurement result.

As shown in FIGS. 1 to 3, each of the first magnetic body 171 and the second magnetic body 172 preferably has a plate shape, and includes a first plate portion and a second plate portion perpendicular or substantially perpendicular to the first plate portion. A thickness direction of each of the first magnetic body 171 and the second magnetic body 172 extends along the first surface of the substrate 130. The primary conductor 110 and each first plate portion of the first magnetic body 171 and the second magnetic body 172 are positioned in parallel or substantially parallel or substantially parallel to each other.

Two gaps are provided in the magnetic body 170 including the first magnetic body 171 and the second magnetic body 172 so that the magnetic body 170 preferably has a rectangular or substantially rectangular tube shape that is discontinuous in a circumference direction thereof due to the two gaps. Note that the gap is not absolutely necessary to be provided, and the magnetic body 170 may have a rectangular or substantially rectangular tube shape that continuously extends across the whole circumference thereof. In this case, the magnetic body 170 includes a single magnetic body.

The first magnetic body 171 and the second magnetic body 172 preferably have a rectangular or substantially rectangular shape including the gaps each provided between respective end portions thereof when viewed in a direction perpendicular or substantially perpendicular to the first surface of the substrate 130, and surround the primary conductor 110, the first magnetic sensor, and the second magnetic sensor.

Each of the two gaps extends from one end to another end of the magnetic body 170 in the direction perpendicular or substantially perpendicular to the first surface of the substrate 130. The two gaps are respectively positioned diagonally to each other in the rectangular or substantially rectangular shape of the magnetic body 170 when viewed in the direction perpendicular or substantially perpendicular to the first surface of the substrate 130. Further, when viewed in the direction perpendicular or substantially perpendicular to the first surface of the substrate 130, a center position of the rectangular or substantially rectangular shape of the magnetic body 170 overlaps with a position of the through-hole 131 for the primary conductor 110.

As for the first magnetic body 171, a portion in the width direction of the first magnetic body 171 is located in the first through-groove 132. In the present preferred embodiment, as shown in FIG. 3, substantially half of a width of the first magnetic body 171 is located in the first through-groove 132. The first magnetic body 171 does not stick out from the second surface of the substrate 130. A dimension of the thickness of the first magnetic body 171 is slightly smaller than a dimension of the groove width of the first through-groove 132.

As for the second magnetic body 172, a portion in the width direction of the second magnetic body 172 is located in the second through-groove 133. In the present preferred embodiment, as shown in FIG. 3, substantially half of a width of the second magnetic body 172 is located in the second through-groove 133. The second magnetic body 172 does not stick out from the second surface of the substrate 130. A dimension of the thickness of the second magnetic body 172 is slightly smaller than a dimension of the groove width of the second through-groove 133.

Each of the first magnetic sensor and the second magnetic sensor is located at a position equivalent to a position at or substantially at the center of the width of each of the first magnetic body 171 and the second magnetic body 172 in the direction perpendicular or substantially perpendicular to the first surface of the substrate 130.

Although each of the first magnetic body 171 and the second magnetic body 172 preferably is made of PB Permalloy, the material of each of the first magnetic body 171 and the second magnetic body 172 is not limited to the PB Permalloy, and it is sufficient for the material thereof to be a magnetic material having high magnetic permeability and high saturation flux density such as PC Permalloy, soft steel, silicon steel, electromagnetic steel, a nickel alloy, an iron alloy, ferrite, or the like. Surface finishing such as plating, coating, or the like may be performed on a surface of each of the first magnetic body 171 and the second magnetic body 172. Performing the surface finishing on each of the first magnetic body 171 and second magnetic body 172 makes it possible to improve adhesion properties with respect to solder or adhesive to be explained later, enhance conductive properties, realize rust prevention, and so on.

In the present preferred embodiment, each of the first magnetic body 171 and the second magnetic body 172 is preferably formed by performing press working on a thin plate. Note that, however, the forming method for each of the first magnetic body 171 and the second magnetic body 172 is not limited thereto, and each of the first magnetic body 171 and the second magnetic body 172 may be formed by a method such as cutting work, casting, or the like.

The first magnetic body 171 is bonded to the plating film of the first through-groove 132 with a conductive bonding agent 180 formed of solder, a conductive adhesive, or the like so as to be fixed to the substrate 130. The second magnetic body 172 is bonded to the plating film of the second through-groove 133 with the conductive bonding agent 180 formed of solder, a conductive adhesive, or the like so as to be fixed to the substrate 130.

In the case where each of the first magnetic body 171 and the second magnetic body 172 is fixed to the substrate 130 with the conductive bonding agent 180, a potential of each of the first magnetic body 171 and the second magnetic body 172 is able to be fixed to a ground potential or a constant potential by causing each of the first through-groove 132 and the second through-groove 133 to be fixed to the ground potential or the constant potential. Note that each of the first magnetic body 171 and the second magnetic body 172 may be fixed to the substrate 130 with an insulative adhesive or the like.

It is preferable for the gaps between the first magnetic body 171 and the second magnetic body 172 to be filled with a material of which relative magnetic permeability is approximately 1. Specifically, it is preferable that the gaps be filled with a resin, an inorganic object, ceramics, a composite material thereof, the air, or the like. As the resin, a polyphenylene sulfide resin, a polybutylene terephthalate resin, a liquid crystal polymer, a polyamide-based resin, an epoxy resin, a phenol resin, or the like can be used. As the inorganic object, glass or the like can be used. As the ceramics, alumina, steatite, or the like can be used.

As shown in FIG. 1, the current sensor module preferably includes a mother board 10 and three current sensors 100 mounted on the mother board 10. The mother board 10 preferably is a component of an inverter, for example.

In the mother board 10, there are preferably provided three rectangular or substantially rectangular through-holes into which the primary conductors 110 are located. On a first surface of the mother board 10, a plurality of lands 11 respectively connected to the plurality of through-hole electrodes 134 of the current sensors 100 are provided. One end of each of the plurality of lands 11 is electrically connected to a through-hole electrode 12. The plurality of through-hole electrodes 134 are respectively connected to the plurality of lands 11 with solder 13 in a state where the current sensors 100 are mounted on the mother board 10.

The three current sensors 100 are spaced from each other in the width direction of the primary conductor 110 in a state of being mounted on the mother board 10. In the state of being mounted on the mother board 10, the first surface of each of the substrates 130 of the three current sensors 100 is positioned parallel or substantially parallel to the first surface of the mother board 10.

Hereinafter, operations of the current sensor 100 will be described.

When a current flows through the primary conductor 110, a magnetic field circulating clockwise around the primary conductor 110 is generated by what is called the corkscrew rule. As a result, the magnetic field is applied to the first and second magnetic sensors such that a direction of the magnetic field applied to the first magnetic sensor and a direction of the magnetic field applied to the second magnetic sensor are opposite to each other in the width direction of the primary conductor 110.

Because of this, with regard to a strength of the magnetic field generated by the current flowing through the primary conductor 110, a phase of a detection value of the first magnetic sensor and a phase of a detection value of the second magnetic sensor are reverse to each other.

As such, in the case where the strength of the magnetic field detected by the first magnetic sensor has a positive value, the strength of the magnetic field detected by the second magnetic sensor has a negative value. The respective detection values of the first and second magnetic sensors are transmitted to the calculator 140.

The calculator 140 subtracts the detection value of the second magnetic sensor from the detection value of the first magnetic sensor. As a result, an absolute value of the detection value of the first magnetic sensor and an absolute value of the detection value of the second magnetic sensor are added. From this addition result, a value of the current having flowed through the primary conductor 110 is calculated.

In the current sensor 100 according to the present preferred embodiment, because the primary conductor 110 is positioned between the first magnetic sensor and the second magnetic sensor, an external magnetic field source cannot be physically positioned between the first magnetic sensor and the second magnetic sensor.

As such, a direction of a magnetic field component in the detection axis direction of the magnetic field applied to the first magnetic sensor from the external magnetic field source and a direction of a magnetic field component in the detection axis direction of the magnetic field applied to the second magnetic sensor from the external magnetic field source are the same. Accordingly, in the case where the strength of the external magnetic field detected by the first magnetic sensor has a positive value, the strength of the external magnetic field detected by the second magnetic sensor also has a positive value.

As a result, by the calculator 140 subtracting the detection value of the second magnetic sensor from the detection value of the first magnetic sensor, subtraction is performed on an absolute value of the detection value of the first magnetic sensor and an absolute value of the detection value of the second magnetic sensor, such that the magnetic field from the external magnetic field source is hardly detected. In other words, any influence of the external magnetic field is significantly reduced or prevented.

As a first variation of the present preferred embodiment, the detection axis direction of the first magnetic sensor in which the detection value becomes positive and the detection axis direction of the second magnetic sensor in which the detection value becomes positive may be set to be opposite to each other (opposite by 180 degrees). In this case, when the strength of the external magnetic field detected by the first magnetic sensor has a positive value, the strength of the external magnetic field detected by the second magnetic sensor has a negative value.

Meanwhile, with regard to the strength of the magnetic field generated by the current flowing through the primary conductor 110, a phase of the detection value of the first magnetic sensor matches a phase of the detection value of the second magnetic sensor.

In the first variation, in place of the differential amplifier, an adder or a summing amplifier is preferably used as the calculator 140. As for the strength of the external magnetic field, by adding the detection value of the first magnetic sensor and the detection value of the second magnetic sensor with the adder or summing amplifier, subtraction is performed on an absolute value of the detection value of the first magnetic sensor and an absolute value of the detection value of the second magnetic sensor, such that the magnetic field from the external magnetic field source is hardly detected. In other words, any influence of the external magnetic field is significantly reduced or prevented.

Meanwhile, as for the strength of the magnetic field generated by the current flowing through the primary conductor 110, by adding the detection value of the first magnetic sensor and the detection value of the second magnetic sensor with the adder or summing amplifier, an absolute value of the detection value of the first magnetic sensor and an absolute value of the detection value of the second magnetic sensor are added. From this addition result, a value of the current having flowed through the primary conductor 110 is calculated.

As discussed above, the adder or summing amplifier, in place of the differential amplifier, may be used as the calculator in a state where the input-output characteristics of the first magnetic sensor and the second magnetic sensor are set to have opposite polarities to each other.

As shown in FIGS. 1 to 3, in the current sensor 100 according to the present preferred embodiment, because each of the first magnetic sensor and the second magnetic sensor is surrounded by the magnetic body 170, it is possible to prevent a situation where an external magnetic field as an error cause reaches each of the first and second magnetic sensors. As a result, each of the first and second magnetic sensors is prevented from detecting an unwanted external magnetic field. In other words, the magnetic body 170 defines and functions as a magnetic shield.

In the current sensor 100 according to the present preferred embodiment, providing the gaps in the magnetic body 170 increases magnetic resistance against the magnetic flux that circulates inside the magnetic body 170 due to the magnetic field generated by the current flowing through the primary conductor 110 or the external magnetic field. This makes it possible to prevent a situation where each of the first magnetic body 171 and the second magnetic body 172 is magnetically saturated by the magnetic field generated by the current flowing through the primary conductor 110 or the external magnetic field. With this, since the function as a magnetic shield of the magnetic body 170 is maintained, a situation where the external magnetic field reaches each of the first and second magnetic sensors is prevented.

In the current sensor 100 according to the present preferred embodiment, because a portion of the magnetic body 170 is located in the grooves of the substrate 130 and the magnetic body 170 surrounds the magnetic sensors 120, the current sensor 100 is able to be thinned in the direction perpendicular or substantially perpendicular to the first surface of the substrate 130. In other words, the current sensor 100 is able to be miniaturized. In addition, durability of the current sensor 100 is enhanced by increasing rigidity of the magnetic body 170.

Because the magnetic body 170 does not stick out from the second surface of the substrate 130, the current sensor 100 is able to be mounted with ease on the first surface of the mother board 10. Because the current sensor 100 and the mother board 10 are electrically connected through the through-hole electrodes 134, a transmission length of the current measurement value signal is able to be shortened. This reduces the occurrence of electromagnetic interference. Fixing the potential of the magnetic body 170 to the ground potential or a constant potential further reduces the occurrence of the electromagnetic interference.

In the direction perpendicular or substantially perpendicular to the first surface of the substrate 130, because the magnetic sensor 120 is located at a position equivalent to a position at or substantially at the center of the width of the magnetic body 170, a situation where the external magnetic field reaches the magnetic sensor 120 is effectively prevented.

Hereinafter, a current sensor according to a second variation of the first preferred embodiment of the present invention will be described. Because the current sensor according to the second variation differs from the current sensor 100 according to the first preferred embodiment only in a point that a groove of the substrate 130 includes a bottom, descriptions of other elements will not be repeated.

Figure 5:
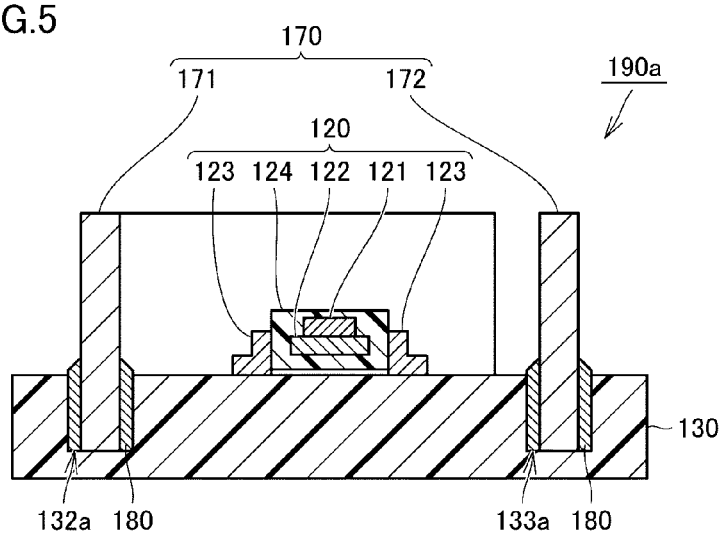
FIG. 5 is a cross-sectional view illustrating a structure of a magnetic sensor unit of a current sensor according to a second variation on the first preferred embodiment of the present invention.

FIG. 5 is a cross-sectional view illustrating a structure of a magnetic sensor unit of the current sensor according to the second variation on the first preferred embodiment of the present invention. In FIG. 5, depicted is a cross section being viewed in the same arrow line direction as in FIG. 3.

As shown in FIG. 5, in a magnetic sensor unit 190*a* of the current sensor according to the second variation on the preferred embodiment, a first bottomed-groove 132*a* and a second bottomed-groove 133*a* are provided in the substrate 130. Each of the first bottomed-groove 132*a* and the second bottomed-groove 133*a* is provided preferably by router processing, for example. A plating film may be provided on an inner circumference surface of each of the first bottomed-groove 132*a* and the second bottomed-groove 133*a*.

Also in the current sensor according to the second variation of the first preferred embodiment, because a portion of the magnetic body 170 is located in the grooves of the substrate 130 and the magnetic body 170 surrounds the magnetic sensors 120, the current sensor is able to be thinned in the direction perpendicular or substantially perpendicular to the first surface of the substrate 130. In other words, the current sensor is able to be miniaturized.

Hereinafter, a current sensor according to a second preferred embodiment of the present invention will be described. Because the current sensor according to the second preferred embodiment differs from the current sensor 100 according to the first preferred embodiment only in a point that respective shapes of magnetic bodies and grooves are different from those of the first preferred embodiment, descriptions of other elements will not be repeated.

Second Preferred Embodiment

Figure 6:
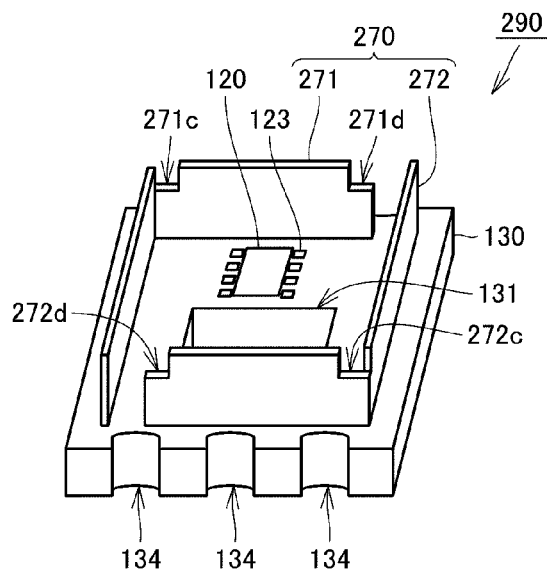
FIG. 6 is a perspective view illustrating an external appearance of a magnetic sensor unit of a current sensor according to a second preferred embodiment of the present invention.
Figure 7:
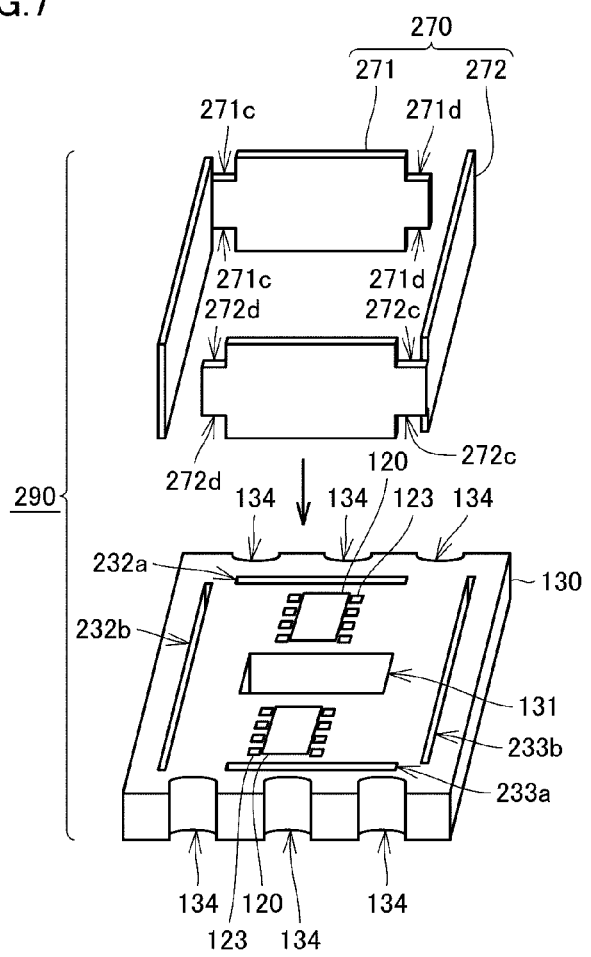
FIG. 7 is an exploded perspective view illustrating a configuration of the magnetic sensor unit of the current sensor according to the second preferred embodiment of the present invention.

FIG. 6 is a perspective view illustrating an external appearance of a magnetic sensor unit of the current sensor according to the second preferred embodiment of the present invention. FIG. 7 is an exploded perspective view illustrating a configuration of the magnetic sensor unit of the current sensor according to the second preferred embodiment of the present invention.

As shown in FIGS. 6 and 7, a magnetic sensor unit 290 of the current sensor according to the second preferred embodiment of the present invention includes a magnetic body 270. The magnetic body 270 includes a first magnetic body 271 and a second magnetic body 272.

The magnetic body 270 including the first magnetic body 271 and the second magnetic body 272 is provided with two gaps, and preferably has a rectangular or substantially rectangular tube shape that is discontinuous in a circumference direction thereof due to the two gaps. The first magnetic body 271 and the second magnetic body 272 preferably have a rectangular or substantially rectangular shape including the gaps each provided between respective end portions thereof when viewed in a direction perpendicular or substantially perpendicular to the first surface of the substrate 130, and surround the primary conductor 110, the first magnetic sensor, and the second magnetic sensor.

Each of the two gaps extends from one end to another end of the magnetic body 270 in the direction perpendicular or substantially perpendicular to the first surface of the substrate 130. The two gaps are respectively positioned diagonally to each other in the rectangular or substantially rectangular shape of the magnetic body 270 when viewed in the direction perpendicular or substantially perpendicular to the first surface of the substrate 130. Further, when viewed in the direction perpendicular or substantially perpendicular to the first surface of the substrate 130, a center position of the rectangular or substantially rectangular shape of the magnetic body 270 overlaps with a position of the through-hole 131 for the primary conductor 110.

Each of the first magnetic body 271 and the second magnetic body 272 preferably has a plate shape, and includes a first plate portion and a second plate portion perpendicular or substantially perpendicular to the first plate portion. A thickness direction of each of the first magnetic body 271 and the second magnetic body 272 extends along the first surface of the substrate 130. Each first plate portion of the first magnetic body 271 and the second magnetic body 272 is positioned in parallel or substantially parallel or substantially parallel to the primary conductor 110.

In the first plate portion of the first magnetic body 271, a pair of cutouts 271*c* is provided at an adjacent segment to the second plate portion; the cutouts 271*c* are recessed from both outer side portions of the first plate portion toward an inner side thereof in the direction perpendicular or substantially perpendicular to the first surface of the substrate 130. At an end portion of the first plate portion of the first magnetic body 271 on the opposite side to the second plate portion side, a pair of cutouts 271*d* is recessed from both the outer side portions of the first plate portion toward the inner side thereof in the direction perpendicular or substantially perpendicular to the first surface of the substrate 130.

In the first plate portion of the second magnetic body 272, a pair of cutouts 272*c* is provided at an adjacent segment to the second plate portion; the cutouts 272*c* are recessed from both the outer side portions of the first plate portion toward the inner side thereof in the direction perpendicular or substantially perpendicular to the first surface of the substrate 130. At an end portion of the first plate portion of the second magnetic body 272 on the opposite side to the second plate portion side, a pair of cutouts 272*d* is recessed from both the outer side portions of the first plate portion toward the inner side thereof in the direction perpendicular or substantially perpendicular to the first surface of the substrate 130.

In the substrate 130, there are provided a first through-groove 232*a* in which the first plate portion of the first magnetic body 271 is located, a first through-groove 232*b* in which the second plate portion of the first magnetic body 271 is located, a second through-groove 233*a* in which the first plate portion of the second magnetic body 272 is located, and a second through-groove 233*b* in which the second plate portion of the second magnetic body 272 is located.

Each of the first through-groove 232*a*, the first through-groove 232*b*, the second through-groove 233*a*, and the second through-groove 233*b* extends linearly along the edge of the substrate 130. No through-groove is provided at a position corresponding to each of the cutout 271*c*, the cutout 271*d*, the cutout 272*c*, and the cutout 272*d*.

Also in the current sensor according to the second preferred embodiment of the present invention, because a portion of the magnetic body 270 is located in the grooves of the substrate 130 and the magnetic body 270 surrounds the magnetic sensors 120, the current sensor is able to be thinned in the direction perpendicular or substantially perpendicular to the first surface of the substrate 130. In other words, the current sensor is able to be miniaturized.

Hereinafter, a current sensor according to a third preferred embodiment of the present invention will be described. Because the current sensor according to the third preferred embodiment differs from the current sensor according to the second preferred embodiment only in a point that magnetic bodies are provided in a double formation, descriptions of other elements will not be repeated.

Third Preferred Embodiment

Figure 8:
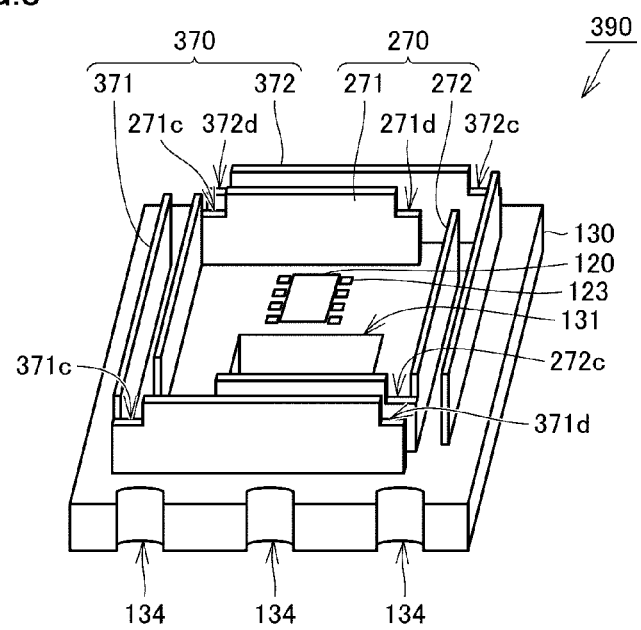
FIG. 8 is a perspective view illustrating an external appearance of a magnetic sensor unit of a current sensor according to a third preferred embodiment of the present invention.
Figure 9:
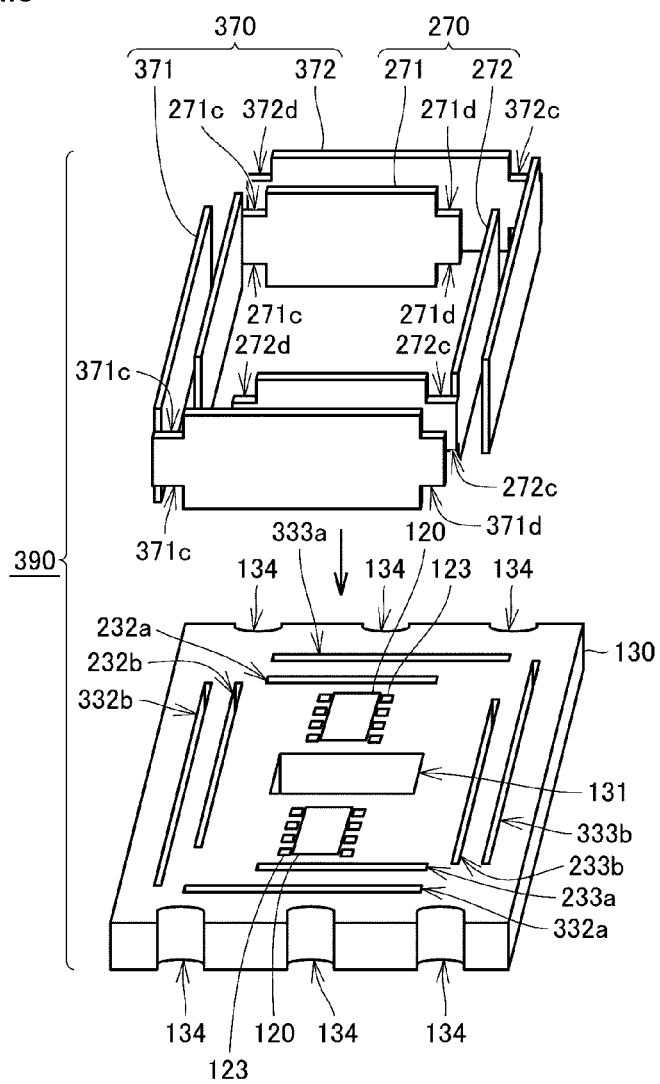
FIG. 9 is an exploded perspective view illustrating a configuration of the magnetic sensor unit of the current sensor according to the third preferred embodiment of the present invention.

FIG. 8 is a perspective view illustrating an external appearance of a magnetic sensor unit of the current sensor according to the third preferred embodiment of the present invention. FIG. 9 is an exploded perspective view illustrating a configuration of the magnetic sensor unit of the current sensor according to the third preferred embodiment of the present invention.

As shown in FIGS. 8 and 9, a magnetic sensor unit 390 of the current sensor according to the third preferred embodiment of the present invention includes a first magnetic body 270 and a second magnetic body 370. The second magnetic body 370 is provided with two gaps, and preferably has a rectangular or substantially rectangular tube shape that is discontinuous in a circumference direction thereof due to the two gaps. In this preferred embodiment, the second magnetic body 370 includes a first magnetic body 371 and a second magnetic body 372. The first magnetic body 371 and the second magnetic body 372 preferably have a rectangular or substantially rectangular shape including the gaps each provided between respective end portions thereof when viewed in a direction perpendicular or substantially perpendicular to the first surface of the substrate 130, and surround the first magnetic body 270 while respectively being spaced from the first magnetic body 270. The gaps of the second magnetic body 370 are positioned in an outer side portion of each bending portion of the first magnetic body 271 and the second magnetic body 272.

Each of the first magnetic body 371 and the second magnetic body 372 preferably has a plate shape, and includes a first plate portion and a second plate portion perpendicular or substantially perpendicular to the first plate portion. A thickness direction of each of the first magnetic body 371 and the second magnetic body 372 extends along the first surface of the substrate 130. Each first plate portion of the first magnetic body 371 and the second magnetic body 372 is positioned parallel or substantially parallel to the primary conductor 110.

In the first plate portion of the first magnetic body 371, a pair of cutouts 371c is provided at an adjacent segment to the second plate portion; the cutouts 371c are recessed from both outer side portions of the first plate portion toward an inner side thereof in the direction perpendicular or substantially perpendicular to the first surface of the substrate 130. At an end portion of the first plate portion of the first magnetic body 371 on the opposite side to the second plate portion side, a pair of cutouts 371d is recessed from both the outer side portions of the first plate portion toward the inner side thereof in the direction perpendicular or substantially perpendicular to the first surface of the substrate 130.

In the first plate portion of the second magnetic body 372, a pair of cutouts 372c is provided at an adjacent segment to the second plate portion; the cutouts 372c are recessed from both the outer side portions of the first plate portion toward the inner side thereof in the direction perpendicular or substantially perpendicular to the first surface of the substrate 130. At an end portion of the first plate portion of the second magnetic body 372 on the opposite side to the second plate portion side, a pair of cutouts 372d is recessed from both the outer side portions of the first plate portion toward the inner side thereof in the direction perpendicular or substantially perpendicular to the first surface of the substrate 130.

In the substrate 130, there are provided a first through-groove 332a in which the first plate portion of the first magnetic body 371 is located, a first through-groove 332b in which the second plate portion of the first magnetic body 371 is located, a second through-groove 333a in which the first plate portion of the second magnetic body 372 is located, and a second through-groove 333b in which the second plate portion of the second magnetic body 372 is located.

Each of the first through-groove 332a, the first through-groove 332b, the second through-groove 333a, and the second through-groove 333b extends linearly along the edge of the substrate 130. No through-groove is provided at a position corresponding to each of the cutout 371c, the cutout 371d, the cutout 372c, and the cutout 372d.

The first through-groove 332a is provided in an outer side portion of the first through-groove 232a parallel or substantially parallel to the first through-groove 232a. The first through-groove 332b is provided in an outer side portion of the first through-groove 232b parallel or substantially parallel to the first through-groove 232b. The second through-groove 333a is provided in an outer side portion of the second through-groove 233a parallel or substantially parallel to the second through-groove 233a. The second through-groove 333b is provided in an outer side portion of the second through-groove 233b parallel or substantially parallel to the second through-groove 233b.

Although each of the first magnetic body 371 and the second magnetic body 372 is preferably made of PB Permalloy, the material of each of the first magnetic body 371 and the second magnetic body 372 is not limited to the PB Permalloy, and it is sufficient for the material thereof to be a magnetic material having high magnetic permeability and high saturation flux density such as PC Permalloy, soft steel, silicon steel, electromagnetic steel, a nickel alloy, an iron alloy, ferrite, or the like.

As shown in FIG. 8, in the current sensor according to the present preferred embodiment, because each of the first magnetic sensor and the second magnetic sensor is doubly surrounded by the first magnetic body 270 and the second magnetic body 370, it is possible to prevent a situation where an external magnetic field as an error cause reaches each of the first and second magnetic sensors. As a result, each of the first and second magnetic sensors is able to be prevented from detecting an unwanted external magnetic field. In other words, each of the first magnetic body 270 and the second magnetic body 370 defines and functions as a magnetic shield.

In addition, the gaps of the second magnetic body 370 are positioned in the outer side portion of each bending portion of the first magnetic body 271 and the second magnetic body 272, such that the first and second magnetic sensors are able to be nearly completely surrounded by the first magnetic body 270 and the second magnetic body 370. This makes it possible to surely prevent a situation where an external magnetic field as an error cause reaches each of the first and second magnetic sensors.

Also in the current sensor according to the third preferred embodiment of the present invention, because a portion of each of the first magnetic body 270 and the second magnetic body 370 is located in the grooves of the substrate 130, and the magnetic sensors 120 are doubly surrounded by the first magnetic body 270 and the second magnetic body 370, the current sensor is able to be thinned in the direction perpendicular or substantially perpendicular to the first surface of the substrate 130. In other words, the current sensor is able to be miniaturized.

Hereinafter, a current sensor according to a fourth preferred embodiment of the present invention will be described. Because the current sensor according to the fourth preferred embodiment differs from the current sensor 100 according to the first preferred embodiment only in a point that respective shapes of magnetic bodies and grooves are different from those of the first preferred embodiment, descriptions of other elements will not be repeated.

Fourth Preferred Embodiment

Figure 10:
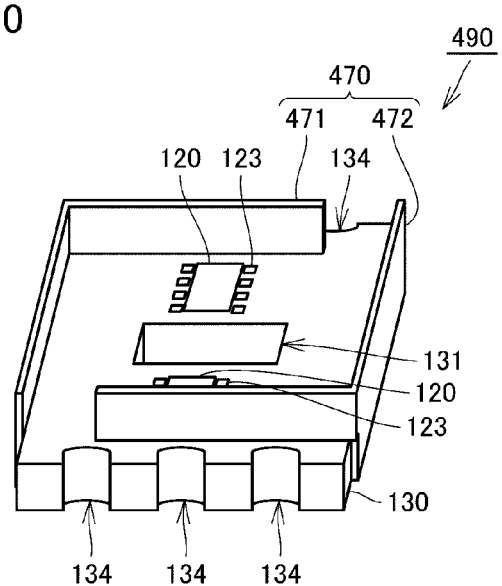
FIG. 10 is a perspective view illustrating an external appearance of a magnetic sensor unit of a current sensor according to a fourth preferred embodiment of the present invention.
Figure 11:
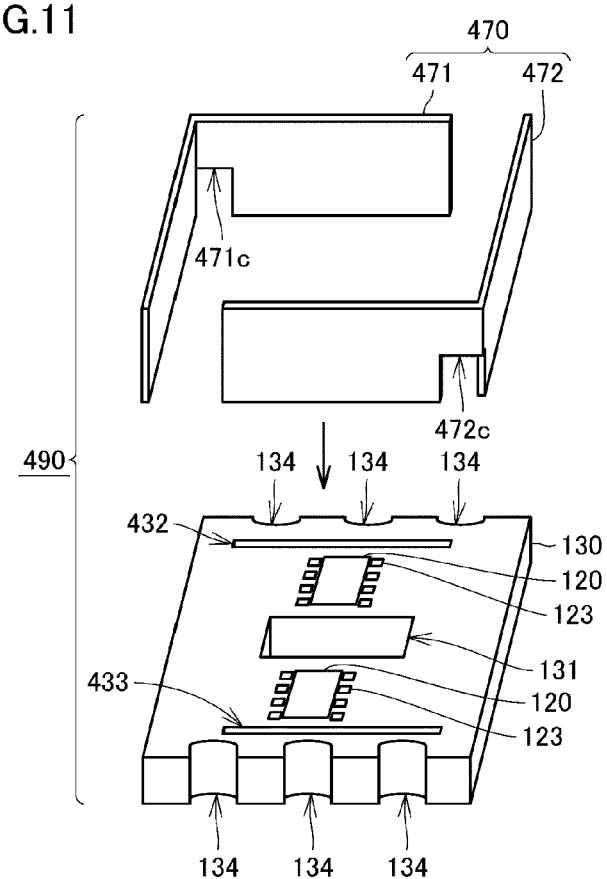
FIG. 11 is an exploded perspective view illustrating a configuration of the magnetic sensor unit of the current sensor according to the fourth preferred embodiment of the present invention.

FIG. 10 is a perspective view illustrating an external appearance of a magnetic sensor unit of the current sensor according to the fourth preferred embodiment of the present invention. FIG. 11 is an exploded perspective view illustrating a configuration of the magnetic sensor unit of the current sensor according to the fourth preferred embodiment of the present invention.

As shown in FIGS. 10 and 11, a magnetic sensor unit 490 of the current sensor according to the fourth preferred embodiment of the present invention includes a magnetic body 470. The magnetic body 470 includes a first magnetic body 471 and a second magnetic body 472.

The magnetic body 470 including the first magnetic body 471 and the second magnetic body 472 is provided with two gaps, and preferably has a rectangular or substantially rectangular tube shape that is discontinuous in a circumference direction thereof due to the two gaps. The first magnetic body 471 and the second magnetic body 472 preferably have a rectangular or substantially rectangular shape including the gaps each provided between respective end portions thereof when viewed in a direction perpendicular or substantially perpendicular to the first surface of the substrate 130, and surround the primary conductor 110, the first magnetic sensor, and the second magnetic sensor.

Each of the two gaps extends from one end to another end of the magnetic body 470 in the direction perpendicular or substantially perpendicular to the first surface of the substrate 130. The two gaps are respectively positioned diagonally to each other in the rectangular or substantially rectangular shape of the magnetic body 470 when viewed in the direction perpendicular or substantially perpendicular to the first surface of the substrate 130. Further, when viewed in the direction perpendicular or substantially perpendicular to the first surface of the substrate 130, a center position of the rectangular or substantially rectangular shape of the magnetic body 470 overlaps with a position of the through-hole 131 for the primary conductor 110.

Each of the first magnetic body 471 and the second magnetic body 472 preferably has a plate shape, and includes a first plate portion and a second plate portion perpendicular or substantially perpendicular to the first plate portion. A thickness direction of each of the first magnetic body 471 and the second magnetic body 472 extends along the first surface of the substrate 130. Each first plate portion of the first magnetic body 471 and the second magnetic body 472 is positioned parallel or substantially parallel to the primary conductor 110.

In the first plate portion of the first magnetic body 471, a cutout 471c is provided at an adjacent segment to the second plate portion; the cutout 471c is recessed from an outer side portion of the first plate portion toward an inner side thereof in the direction perpendicular or substantially perpendicular to the first surface of the substrate 130. The cutout 471c is provided on a side in a width direction of the first magnetic body 471 from which the first magnetic body 471 is located in the substrate 130.

In the first plate portion of the second magnetic body 472, a cutout 472c is provided at an adjacent segment to the second plate portion; the cutout 472c is recessed from an outer side portion of the first plate portion toward an inner side thereof in the direction perpendicular or substantially perpendicular to the first surface of the substrate 130. The cutout 472c is provided on a side in a width direction of the second magnetic body 472 from which the second magnetic body 472 is located in the substrate 130.

In the substrate 130, there are provided a first through-groove 432 in which the first plate portion of the first magnetic body 471 is located, and a second through-groove 433 in which the first plate portion of the second magnetic body 472 is located. Each of the first through-groove 432 and the second through-groove 433 is linearly provided along the edge of the substrate 130. No through-groove is provided at a position corresponding to each of the cutout 471c and the cutout 472c.

The second plate portion of the first magnetic body 471 is positioned along a circumference surface of the substrate 130, and is bonded to a ground electrode provided on the circumference surface of the substrate 130 with solder. The second plate portion of the second magnetic body 472 is positioned along the circumference surface of the substrate 130, and is bonded to the ground electrode provided on the circumference surface of the substrate 130 with solder.

Also in the current sensor according to the fourth preferred embodiment of the present invention, because a portion of the magnetic body 470 is located in the grooves of the substrate 130 and the magnetic sensors 120 are surrounded by the magnetic body 470, the current sensor is able to be thinned in the direction perpendicular or substantially perpendicular to the first surface of the substrate 130. In other words, the current sensor is able to be miniaturized.

Hereinafter, a current sensor according to a fifth preferred embodiment of the present invention will be described. Because the current sensor according to the fifth preferred embodiment differs from the current sensor according to the fourth preferred embodiment only in a point that a shape of a magnetic body is different from that of the fourth preferred embodiment, descriptions of other elements will not be repeated.

Fifth Preferred Embodiment

Figure 12:
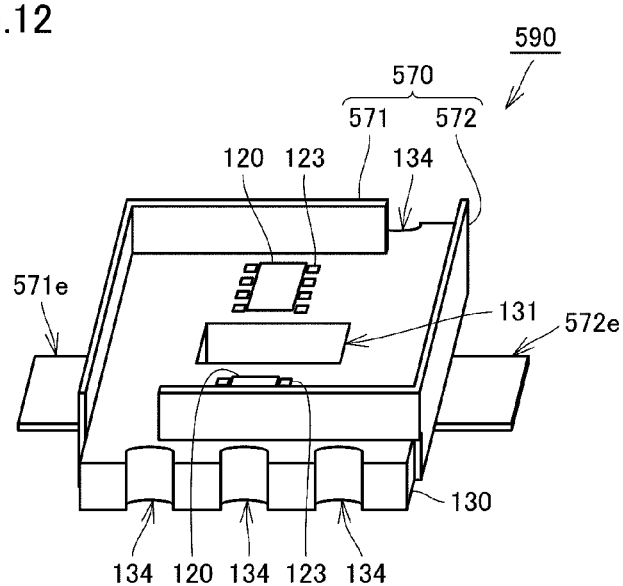
FIG. 12 is a perspective view illustrating an external appearance of a magnetic sensor unit of a current sensor according to a fifth preferred embodiment of the present invention.
Figure 13:
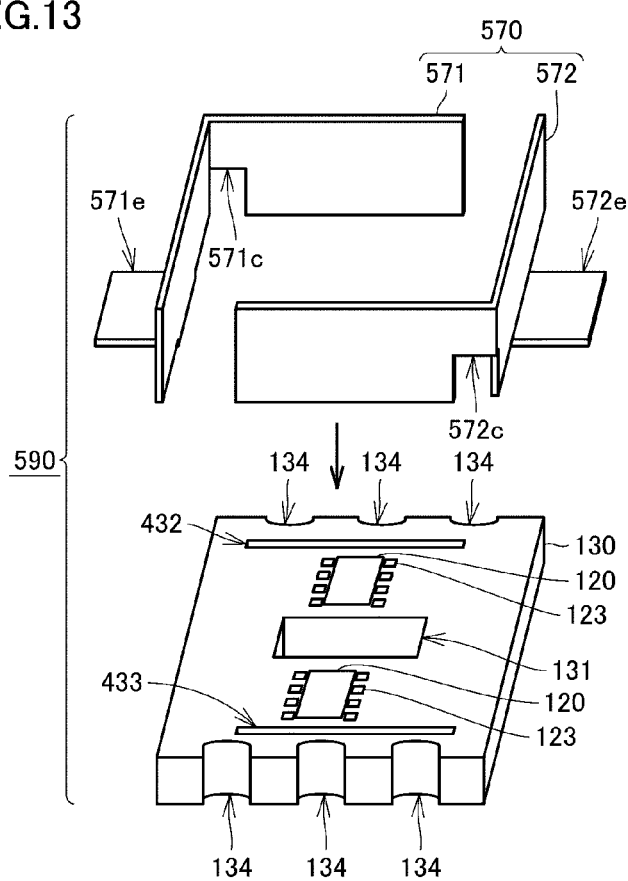
FIG. 13 is an exploded perspective view illustrating a configuration of the magnetic sensor unit of the current sensor according to the fifth preferred embodiment of the present invention.

FIG. 12 is a perspective view illustrating an external appearance of a magnetic sensor unit of the current sensor according to the fifth preferred embodiment of the present invention. FIG. 13 is an exploded perspective view illustrating a configuration of the magnetic sensor unit of the current sensor according to the fifth preferred embodiment of the present invention.

As shown in FIGS. 12 and 13, a magnetic sensor unit 590 of the current sensor according to the fifth preferred embodiment of the present invention includes a magnetic body 570. The magnetic body 570 includes a first magnetic body 571 and a second magnetic body 572.

The magnetic body 570 including the first magnetic body 571 and the second magnetic body 572 is provided with two gaps, and preferably has a rectangular or substantially rectangular tube shape that is discontinuous in a circumference direction thereof due to the two gaps. The first magnetic body 571 and the second magnetic body 572 preferably have a rectangular or substantially rectangular shape including the gaps each provided between respective end portions thereof when viewed in a direction perpendicular or substantially perpendicular to the first surface of the substrate 130, and surround the primary conductor 110, the first magnetic sensor, and the second magnetic sensor.

Each of the two gaps extends from one end to another end of the magnetic body 570 in the direction perpendicular or substantially perpendicular to the first surface of the substrate 130. The two gaps are respectively positioned diagonally to each other in the rectangular or substantially rectangular shape of the magnetic body 570 when viewed in the direction perpendicular or substantially perpendicular to the first surface of the substrate 130. Further, when viewed in the direction perpendicular or substantially perpendicular to the first surface of the substrate 130, a center position of the rectangular or substantially rectangular shape of the magnetic body 570 overlaps with a position of the through-hole 131 for the primary conductor 110.

Each of the first magnetic body 571 and the second magnetic body 572 preferably has a plate shape, and includes a first plate portion and a second plate portion perpendicular or substantially perpendicular to the first plate portion. A thickness direction of each of the first magnetic body 571 and the second magnetic body 572 extends along the first surface of the substrate 130. Each first plate portion of the first magnetic body 571 and the second magnetic body 572 is positioned parallel or substantially parallel to the primary conductor 110.

In the first plate portion of the first magnetic body 571, a cutout 571c is provided at an adjacent segment to the second plate portion; the cutout 571c is recessed from an outer side portion of the first plate portion toward an inner side thereof in the direction perpendicular or substantially perpendicular to the first surface of the substrate 130. The cutout 571c is provided on a side in a width direction of the first magnetic body 571 from which the first magnetic body 571 is located in the substrate 130.

On the second plate portion of the first magnetic body 571, there is provided a projection 571e that projects from the second plate portion being bent at right angles. The projection 571e is provided on a side in the width direction of the first magnetic body 571 where the cutout 571c of the first magnetic body 571 is positioned.

In the first plate portion of the second magnetic body 572, a cutout 572c is provided at an adjacent segment to the second plate portion; the cutout 572c is recessed from an outer side portion of the first plate portion toward an inner side thereof in the direction perpendicular or substantially perpendicular to the first surface of the substrate 130. The cutout 572c is provided on a side in the width direction of the second magnetic body 572 from which the second magnetic body 572 is located in the substrate 130.

On the second plate portion of the second magnetic body 572, there is provided a projection 572e that projects from the second plate portion being bent at right angles. The projection 572e is provided on a side in the width direction of the second magnetic body 572 where the cutout 572c of the second magnetic body 572 is positioned.

By connecting each of the projection 571e and the projection 572e to a ground electrode of the mother board 10 with solder, the strength of bonding between the current sensor and the mother board 10 is enhanced.

Also in the current sensor according to the fifth preferred embodiment of the present invention, because a portion of the magnetic body 570 is located in the grooves of the substrate 130 and the magnetic sensors 120 are surrounded by the magnetic body 570, the current sensor is able to be thinned in the direction perpendicular or substantially perpendicular to the first surface of the substrate 130. In other words, the current sensor is able to be miniaturized.

Hereinafter, a current sensor according to a sixth preferred embodiment of the present invention will be described. Because the current sensor according to the sixth preferred embodiment differs from the current sensor 100 according to the first preferred embodiment only in a point that a structure of a connection terminal with the mother board is different from that of the first preferred embodiment, descriptions of other elements will not be repeated.

Sixth Preferred Embodiment

Figures 14, 15:
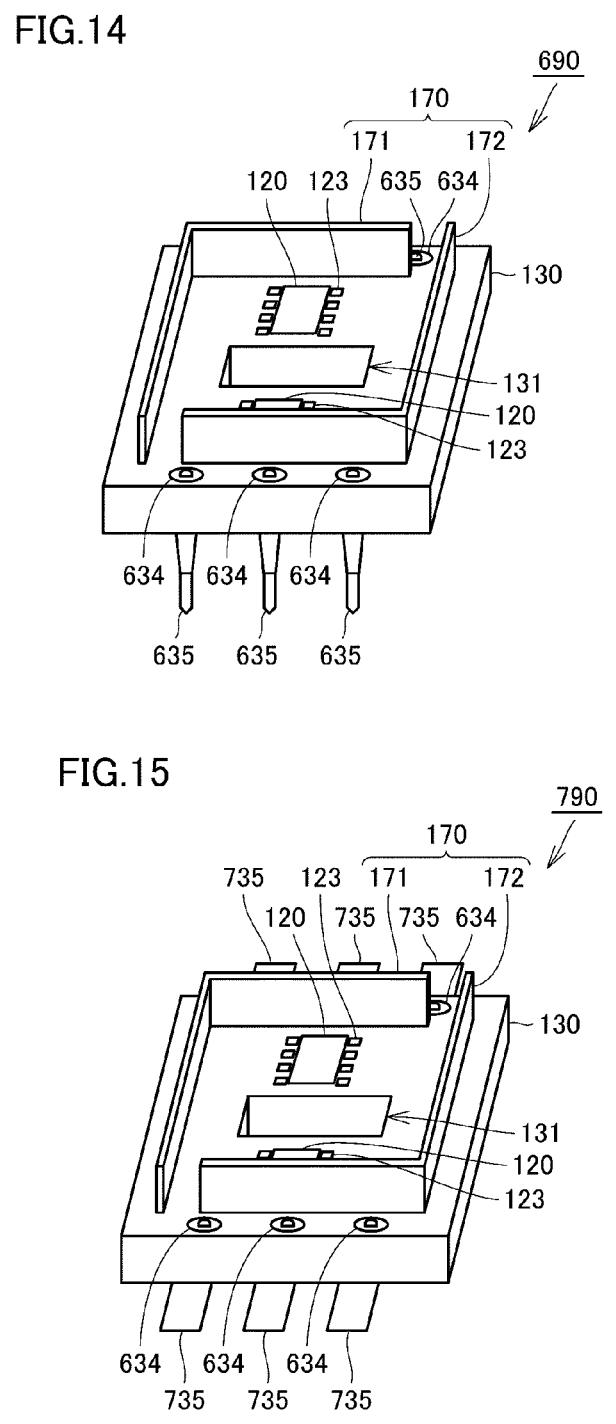

FIG. 14 is a perspective view illustrating an external appearance of a magnetic sensor unit of the current sensor according to the sixth preferred embodiment of the present invention. As shown in FIG. 14, in a magnetic sensor unit 690 of the current sensor according to the sixth preferred embodiment of the present invention, a plurality of cylindrical through-hole electrodes 634 connecting the first surface and the second surface opposing the first surface of the substrate 130 are provided in the substrate 130.

A pin-shaped connection terminal 635 is located in each of the plurality of through-hole electrodes 634 to be bonded with solder. The structure of the connection terminal is not limited to the above one, and may be such that, for example, a fork connection terminal is bonded to the substrate 130 with solder or a conductive adhesive while pinching an end portion of the substrate 130.

In the mother board 10, a plurality of holes are provided at positions corresponding to a plurality of connection terminals 635. The connection terminals 635 are respectively located in the holes of the mother board 10 and bonded by soldering, so that the current sensor is mounted on the mother board 10. A plating film to become an electrode is provided on an inner circumference of each of the holes of the mother board 10.

Also in the current sensor according to the sixth preferred embodiment of the present invention, because a portion of the magnetic body 170 is located in the grooves of the substrate 130 and the magnetic sensors 120 are surrounded by the magnetic body 170, the current sensor is able to be thinned in the direction perpendicular or substantially perpendicular to the first surface of the substrate 130. In other words, the current sensor is able to be miniaturized.

Hereinafter, a current sensor according to a seventh preferred embodiment of the present invention will be described. Because the current sensor according to the seventh preferred embodiment differs from the current sensor 100 according to the first preferred embodiment only in a point that a structure of a connection terminal with the mother board is different from that of the first preferred embodiment, descriptions of other elements will not be repeated.

Seventh Preferred Embodiment

FIG. 15 is a perspective view illustrating an external appearance of a magnetic sensor unit of the current sensor according to the seventh preferred embodiment of the present invention. As shown in FIG. 15, in a magnetic sensor unit 790 of the current sensor according to the seventh preferred embodiment of the present invention, a plurality of cylindrical through-hole electrodes 634 connecting the first surface and the second surface opposing the first surface of the substrate 130 are provided in the substrate 130.

A connection terminal 735 is located in each of the plurality of through-hole electrodes 634 to be bonded with solder. The connection terminal 735 has a columnar column portion at one end side thereof and a plate portion in a plate shape at another end side thereof. Further, the connection terminal 735 is bent between the column portion and the plate portion.

The column portion of the connection terminal 735 is located in the through-hole electrode 634. The plate portion of the connection terminal 735 extends along the second surface of the substrate 130 and is electrically connected to the land 11 of the mother board 10 by resistance welding or laser welding.

Also in the current sensor according to the seventh preferred embodiment of the present invention, because a portion of the magnetic body 170 is located in the grooves of the substrate 130 and the magnetic sensors 120 are surrounded by the magnetic body 170, the current sensor is able to be thinned in the direction perpendicular or substantially perpendicular to the first surface of the substrate 130. In other words, the current sensor is able to be miniaturized.

Hereinafter, a current sensor according to an eighth preferred embodiment of the present invention will be described. Because the current sensor according to the eighth preferred embodiment differs from the current sensor 100 according to the first preferred embodiment mainly in a point that a shape of a magnetic body, a shape of a groove, and arrangement of a magnetic sensor are different from those of the first preferred embodiment, descriptions of other elements will not be repeated.

Eighth Preferred Embodiment

Figure 16:
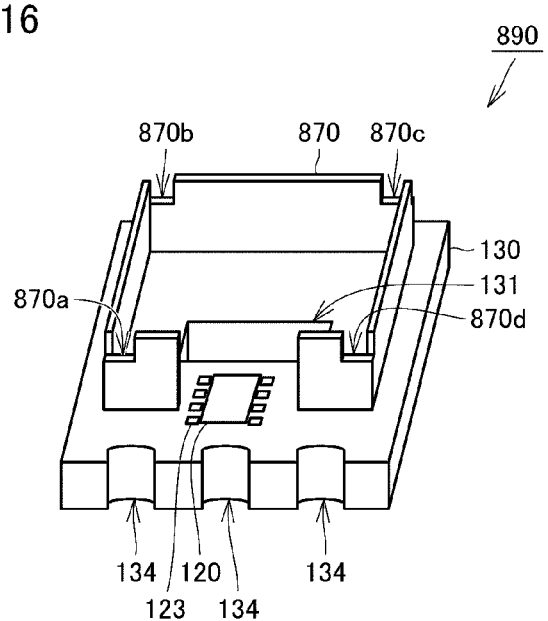
FIG. 16 is a perspective view illustrating an external appearance of a magnetic sensor unit of a current sensor according to an eighth preferred embodiment of the present invention.
Figure 17:
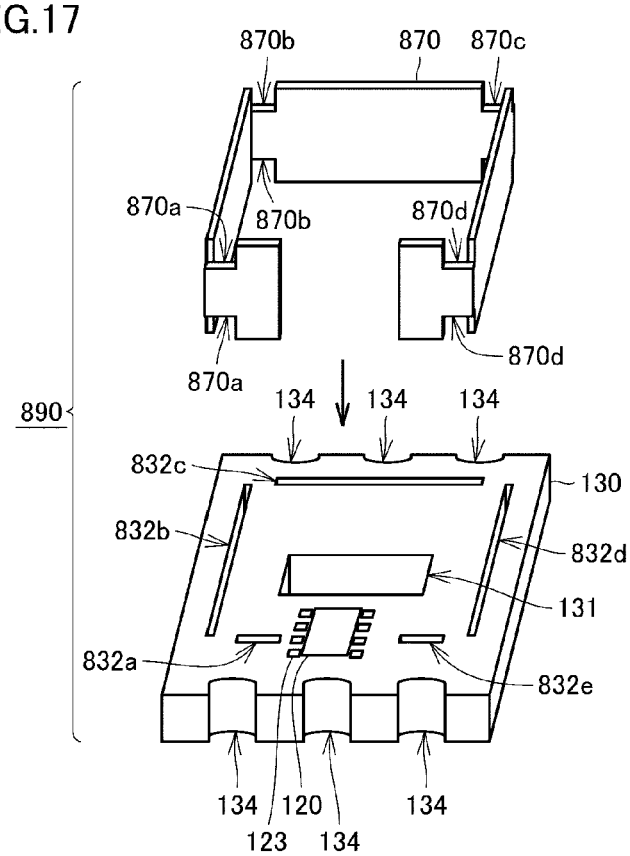
FIG. 17 is an exploded perspective view illustrating a configuration of the magnetic sensor unit of the current sensor according to the eighth preferred embodiment of the present invention.

FIG. 16 is a perspective view illustrating an external appearance of a magnetic sensor unit of the current sensor according to the eighth preferred embodiment of the present invention. FIG. 17 is an exploded perspective view illustrating a configuration of the magnetic sensor unit of the current sensor according to the eighth preferred embodiment of the present invention.

As shown in FIGS. 16 and 17, a magnetic sensor unit 890 of the current sensor according to the eighth preferred embodiment of the present invention includes a single magnetic sensor 120 and a magnetic body 870. The magnetic body 870 includes a single magnetic body preferably with a C shape when viewed in a direction perpendicular or substantially perpendicular to the first surface of the substrate 130.

The magnetic body 870 is preferably has a rectangular or substantially rectangular shape including at least one gap provided between end portions of the member when viewed in the direction perpendicular or substantially perpendicular to the first surface of the substrate 130, and surrounds the primary conductor 110. The magnetic sensor 120 is provided in the gap of the magnetic body 870.

The magnetic body 870 preferably has a plate shape, and includes a first plate portion, a pair of second plate portions opposing each other and being perpendicular or substantially perpendicular to the first plate portion, and a pair of third plate portions respectively being perpendicular or substantially perpendicular to the pair of second plate portions and opposing the first plate portion. The gap is provided between the pair of third plate portions.

A thickness direction of the magnetic body 870 extends along the first surface of the substrate 130. The first plate portion and the pair of third plate portions of the magnetic body 870 of the magnetic body are positioned parallel or substantially parallel to the primary conductor 110.

In the first plate portion of the magnetic body 870, a pair of cutouts 870b is provided at an adjacent segment to one of the second plate portions; the cutouts 870b are recessed from both outer side portions of the first plate portion toward an inner side thereof in the direction perpendicular or substantially perpendicular to the first surface of the substrate 130. Further, in the first plate portion of the magnetic body 870, a pair of cutouts 870c is provided at an adjacent segment to the other of the second plate portions; the cutouts 870c are recessed from both the outer side portions of the first plate portion toward the inner side thereof in the direction perpendicular or substantially perpendicular to the first surface of the substrate 130.

In one of the third plate portions of the magnetic body 870, a pair of cutouts 870a is provided at an adjacent segment to the one of the second plate portions; the cutouts 870a are recessed from both outer side portions of the third plate portion toward the inner side thereof in the direction perpendicular or substantially perpendicular to the first surface of the substrate 130. Further, in the other of the third plate portions of the magnetic body 870, a pair of cutouts 870d is provided at an adjacent segment to the other of the second plate portions; the cutouts 870d are recessed from both the outer side portions of the third plate portion toward the inner side thereof in the direction perpendicular or substantially perpendicular to the first surface of the substrate 130.

In the substrate 130, there are provided a first through-groove 832c in which the first plate portion of the magnetic body 870 is located, a second through-groove 832b in which the one of the second plate portions of the magnetic body 870 is located, a second through-groove 832d in which the other of the second plate portions of the magnetic body 870 is located, a third through-groove 832a in which the one of the third plate portions of the magnetic body 870 is located, and a third through-groove 832e in which the other of the third plate portions of the magnetic body 870 is located. Each of the first through-groove 832c, the second through-grooves 832b and 832d, and the third through-grooves 832a and 832e extends linearly along the edge of the substrate 130. No through-groove is provided at a position corresponding to each of the cutout 870a, the cutout 870b, the cutout 870c, and the cutout 870d.

Also in the current sensor according to the eighth preferred embodiment of the present invention, because a portion of the magnetic body 870 is located in the grooves of the substrate 130 and the magnetic sensor 120 is located in the gap of the magnetic body 870, the current sensor is able to be thinned in the direction perpendicular or substantially perpendicular to the first surface of the substrate 130. In other words, the current sensor is able to be miniaturized.

In the current sensor according to each of the first to eighth preferred embodiments of the present invention, structural elements or features capable of being combined with one another may be appropriately combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
   a substrate in which a through-hole and at least one groove positioned around the through-hole are provided;
   a primary conductor that is located in the through-hole and extends through the substrate, and through which a current to be measured flows;
   at least one magnetic sensor that is mounted on a first surface of the substrate and detects a strength of a magnetic field generated by the current to be measured flowing through the primary conductor; and
   at least one magnetic body surrounding the primary conductor; wherein
   a portion of the at least one magnetic body is located in the at least one groove to be fixed to the substrate; and
   the primary conductor is provided closer to the at least one magnetic sensor than the at least one magnetic body.

2. The current sensor according to claim 1, wherein
   the at least one magnetic body has a plate shape; and
   a thickness direction of the at least one magnetic body extends along the first surface of the substrate.

3. The current sensor according to claim 1, wherein substantially half of a width of the at least one magnetic body is located in the at least one groove.

4. The current sensor according to claim 1, wherein
   the primary conductor has a plate-shaped outer periphery; and
   the at least one magnetic sensor detects a magnetic field in a direction perpendicular or substantially perpendicular to both a thickness direction of the primary conductor and a direction perpendicular or substantially perpendicular to the first surface of the substrate.

5. The current sensor according to claim 1, wherein the at least one magnetic sensor is located on at least one of a first side and a second side in a thickness direction of the primary conductor at a center portion in a width direction of the primary conductor.

6. The current sensor according to claim 1, wherein the at least one magnetic sensor is surrounded by the at least one magnetic body.

7. The current sensor according to claim 1, wherein
   the at least one magnetic body has a rectangular or substantially rectangular shape including at least one gap between end portions of the at least one magnetic body when viewed in a direction perpendicular or substantially perpendicular to the first surface of the substrate; and
   the at least one magnetic sensor is each located in the at least one gap.

8. The current sensor according to claim 1, wherein
   the at least one magnetic sensor includes a first magnetic sensor and a second magnetic sensor; and
   the first magnetic sensor and the second magnetic sensor are positioned such that the primary conductor is interposed between the first magnetic sensor and the second magnetic sensor and the first magnetic sensor and the second magnetic sensor are spaced from the primary conductor.

9. The current sensor according to claim 8, further comprising:
   a calculator that calculates a value of the current by computing a detection value of the first magnetic sensor and a detection value of the second magnetic sensor; wherein
   with regard to the strength of the magnetic field generated by the current flowing through the primary conductor, a phase of the detection value of the first magnetic sensor is reverse to a phase of the detection value of the second magnetic sensor; and
   the calculator is a subtractor or a differential amplifier.

10. The current sensor according to claim 8, further comprising:
    a calculator that calculates a value of the current by computing a detection value of the first magnetic sensor and a detection value of the second magnetic sensor; wherein
    with regard to the strength of the magnetic field generated by the current flowing through the primary conductor, a phase of the detection value of the first magnetic sensor matches a phase of the detection value of the second magnetic sensor; and
    the calculator is an adder or a summing amplifier.

11. The current sensor according to claim 1, wherein the at least one groove extends entirely through the substrate.

12. The current sensor according to claim 1, wherein the at least one groove includes first and second grooves having a rectangular or substantially rectangular shape surrounding the through-hole.

13. The current sensor according to claim 12, wherein each for the first and second grooves has an L shape extending along an edge of the substrate.

14. The current sensor according to claim 1, wherein the at least one groove extends only partially through the substrate.

15. The current sensor according to claim 1, wherein the at least one magnetic body includes first and second magnetic bodies, is provided with two gaps, and has a rectangular or substantially rectangular tube shape that is discontinuous in a circumference direction due to the two gaps.

16. The current sensor according to claim 15, wherein each of the two gaps extends from one end to another end of the at least one magnetic body in a direction perpendicular or substantially perpendicular to the first surface of the substrate.

17. The current sensor according to claim 15, wherein the two gaps are respectively positioned diagonally to each other in the rectangular or substantially rectangular tube shape of the at least one magnetic body.

18. The current sensor according to claim 1, wherein the at least one magnetic sensor and the at least one magnetic body overlap with each other in a plane parallel to the first main surface.

19. A current sensor comprising:
    a substrate in which a through-hole and at least one groove positioned around the through-hole are provided;
    a primary conductor that is located in the through-hole and extends through the substrate, and through which a current to be measured flows;
    a first magnetic sensor and a second magnetic sensor each mounted on a first surface of the substrate and detecting a strength of a magnetic field generated by the current to be measured flowing through the primary conductor;
    at least one magnetic body surrounding the primary conductor;
    a portion of the at least one magnetic body is located in the at least one groove to be fixed to the substrate; and
    a calculator that calculates a value of the current by computing a detection value of the first magnetic sensor and a detection value of the second magnetic sensor; wherein
    the first magnetic sensor and the second magnetic sensor are positioned such that the primary conductor is interposed between the first magnetic sensor and the second magnetic sensor and the first magnetic sensor and the second magnetic sensor are spaced from the primary conductor;

with regard to the strength of the magnetic field generated by the current flowing through the primary conductor, a phase of the detection value of the first magnetic sensor is reverse to a phase of the detection value of the second magnetic sensor; and the calculator is a subtractor or a differential amplifier.

20. A current sensor comprising:

a substrate in which a through-hole and at least one groove positioned around the through-hole are provided;

a primary conductor that is located in the through-hole and extends through the substrate, and through which a current to be measured flows;

a first magnetic sensor and a second magnetic sensor each mounted on a first surface of the substrate and detecting a strength of a magnetic field generated by the current to be measured flowing through the primary conductor;

at least one magnetic body surrounding the primary conductor;

a portion of the at least one magnetic body is located in the at least one groove to be fixed to the substrate; and a calculator that calculates a value of the current by computing a detection value of the first magnetic sensor and a detection value of the second magnetic sensor; wherein the first magnetic sensor and the second magnetic sensor are positioned such that the primary conductor is interposed between the first magnetic sensor and the second magnetic sensor and the first magnetic sensor and the second magnetic sensor are spaced from the primary conductor;

with regard to the strength of the magnetic field generated by the current flowing through the primary conductor, a phase of the detection value of the first magnetic sensor matches a phase of the detection value of the second magnetic sensor; and the calculator is an adder or a summing amplifier.

* * * * *